(12) United States Patent
Hung et al.

(10) Patent No.: US 9,660,042 B1
(45) Date of Patent: May 23, 2017

(54) SEMICONDUCTOR DEVICE AND MANUFACTURING METHOD THEREOF

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Yi-Hui Lee, Taipei (TW); Ying-Cheng Liu, Tainan (TW); Chih-Sen Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/073,633

(22) Filed: Mar. 17, 2016

(30) Foreign Application Priority Data

Feb. 22, 2016 (CN) .......................... 2016 1 0096054

(51) Int. Cl.
*H01L 29/78* (2006.01)
*H01L 21/768* (2006.01)
(Continued)

(52) U.S. Cl.
CPC ........ *H01L 29/45* (2013.01); *H01L 21/26506* (2013.01); *H01L 21/32053* (2013.01);
(Continued)

(58) Field of Classification Search
CPC ... H01L 29/45; H01L 29/0847; H01L 29/495; H01L 29/4966; H01L 29/66568;
(Continued)

(56) References Cited

U.S. PATENT DOCUMENTS

| 7,160,800 B2 | 1/2007 | Wu | |
|---|---|---|---|
| 2012/0056245 A1* | 3/2012 | Kang | .................. H01L 21/0245 257/192 |

(Continued)

OTHER PUBLICATIONS

Lu, Title of Invention: Semiconductor Device and Method of Fabricating the Same, U.S. Appl. No. 14/919,716, filed Oct. 21, 2015.

(Continued)

*Primary Examiner* — Cuong Q Nguyen
*Assistant Examiner* — Tong-Ho Kim
(74) *Attorney, Agent, or Firm* — Winston Hsu; Scott Margo

(57) ABSTRACT

A semiconductor device and manufacturing method thereof are provided in the present invention. A second opening is formed corresponding to a gate structure after a step of forming a first opening corresponding to an epitaxial layer. After the step of forming the second opening, a pre-amorphization implantation process is performed to form an amorphous region in the epitaxial layer, and the influence of the process of forming the second opening on the amorphous region may be avoided. The semiconductor device formed by the manufacturing method of the present invention includes a contact structure and an alloy layer. The contact structure is disposed in the second opening for being electrically connected to a metal gate. The alloy layer is disposed on the metal gate and disposed between the metal gate and the contact structure. The alloy layer includes an alloy of the material of the metal gate.

19 Claims, 10 Drawing Sheets

(51) Int. Cl.
*H01L 29/45* (2006.01)
*H01L 29/08* (2006.01)
*H01L 21/265* (2006.01)
*H01L 21/3205* (2006.01)
*H01L 29/66* (2006.01)
*H01L 29/49* (2006.01)
*H01L 23/535* (2006.01)

(52) U.S. Cl.
CPC .. *H01L 21/76802* (2013.01); *H01L 21/76877* (2013.01); *H01L 23/535* (2013.01); *H01L 29/0847* (2013.01); *H01L 29/495* (2013.01); *H01L 29/4966* (2013.01); *H01L 29/66568* (2013.01); *H01L 29/78* (2013.01)

(58) Field of Classification Search
CPC ............... H01L 29/78; H01L 21/26506; H01L 21/32053; H01L 21/76802; H01L 21/76877; H01L 23/535

USPC .................................................. 257/384, 192
See application file for complete search history.

(56) References Cited

U.S. PATENT DOCUMENTS

| 2013/0273706 A1* | 10/2013 | Hung | .............. H01L 21/823807 438/303 |
| 2016/0071800 A1* | 3/2016 | Hung | ................ H01L 21/76879 257/288 |
| 2016/0268203 A1* | 9/2016 | Lu | ..................... H01L 21/76895 |

OTHER PUBLICATIONS

Lu, Title of Invention: Semiconductor Device and Manufacturing Method Thereof, U.S. Appl. No. 14/882,424, filed Oct. 13, 2015.

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device and a manufacturing method thereof using a pre-amorphization implantation (PAI) process to reduce contact resistance.

2. Description of the Prior Art

The technology of the semiconductor integrated circuit has been continuously improved with time. The products of each new generation of manufacturing process have smaller and more complicate circuit designs compared to the previous generations. The number and density of functional devices in each chip region have to be increased continuously due to the requirements of product innovation. Hence, the size of each device has to be shrunk continuously.

Since the size of the device is continuously shrunk, the influence on the electrical performance (e.g. on current, Ion) of the device due to the contact resistance between the source contact/drain contact and the source junction/drain junction has become significant. Therefore, the research related to the manufacturing process and material are still ongoing in the industry for reducing the contact resistance between the source contact/drain contact and the source junction/drain junction, and for further achieving the objects of device requirements and improving the device performance.

SUMMARY OF THE INVENTION

It is therefore one of the objectives of the present invention to provide a semiconductor device and a manufacturing method thereof, wherein a pre-amorphization implantation (PAI) process is performed for forming an amorphous region in the epitaxial layer after a first opening and a second opening are sequentially formed corresponding to the epitaxial layer and the gate structure respectively. Accordingly, the amorphous region is prevented from being influenced by the process for forming the second opening, and the effect of using the PAI process to reduce the contact resistance is further ensured.

According to an embodiment of the present invention, a manufacturing method of a semiconductor device including following steps is provided. A semiconductor substrate is provided. A gate structure is formed on the semiconductor substrate. An epitaxial layer is formed in the semiconductor substrate, and the epitaxial layer is adjoining to the gate structure. An inter-layer dielectric layer is formed on the gate structure and the epitaxial layer. A first opening is formed, wherein the first opening penetrates the inter-layer dielectric layer and exposes at least one portion of the epitaxial layer. A second opening is formed, wherein the second opening penetrates the inter-layer dielectric layer and exposes at least one portion of the gate structure. The second opening is formed after the step of forming the first opening. A pre-amorphization implantation (PAI) process is performed for forming an amorphous region in the epitaxial layer after the first opening and the second opening are formed.

According to another embodiment of the present invention, a semiconductor device is provided. The semiconductor device includes a semiconductor substrate, a metal gate, an inter-layer dielectric layer, a second opening, a contact structure and an alloy layer. The metal gate is disposed on the semiconductor substrate. The inter-layer dielectric layer is disposed on the metal gate. The second opening penetrates the inter-layer dielectric layer disposed on the metal gate. The contact structure is disposed in the second opening, wherein the contact structure is electrically connected to the metal gate. The alloy layer is disposed on the metal gate, wherein the alloy layer is disposed between the contact structure and the metal gate, and the alloy layer includes an alloy of a material of the metal gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic diagrams illustrating a manufacturing method of a semiconductor device of a first embodiment of the present invention, wherein:

FIG. 2 is a schematic diagram illustrating the manufacturing method subsequent to FIG. 1;

FIG. 3 is a schematic diagram illustrating the manufacturing method subsequent to FIG. 2;

FIG. 4 is a schematic diagram illustrating the manufacturing method subsequent to FIG. 3;

FIG. 5 is a schematic diagram illustrating the manufacturing method subsequent to FIG. 4;

FIG. 6 is a schematic diagram illustrating the manufacturing method subsequent to FIG. 5;

FIG. 7 is a schematic diagram illustrating the manufacturing method subsequent to FIG. 6; and FIG. 8 is a schematic diagram illustrating the manufacturing method subsequent to FIG. 7.

FIGS. 9-10 are schematic diagrams illustrating a manufacturing method of a semiconductor device of a second embodiment of the present invention, wherein:

FIG. 10 is a schematic diagram illustrating the manufacturing method subsequent to FIG. 9.

DETAILED DESCRIPTION

Figure 1:
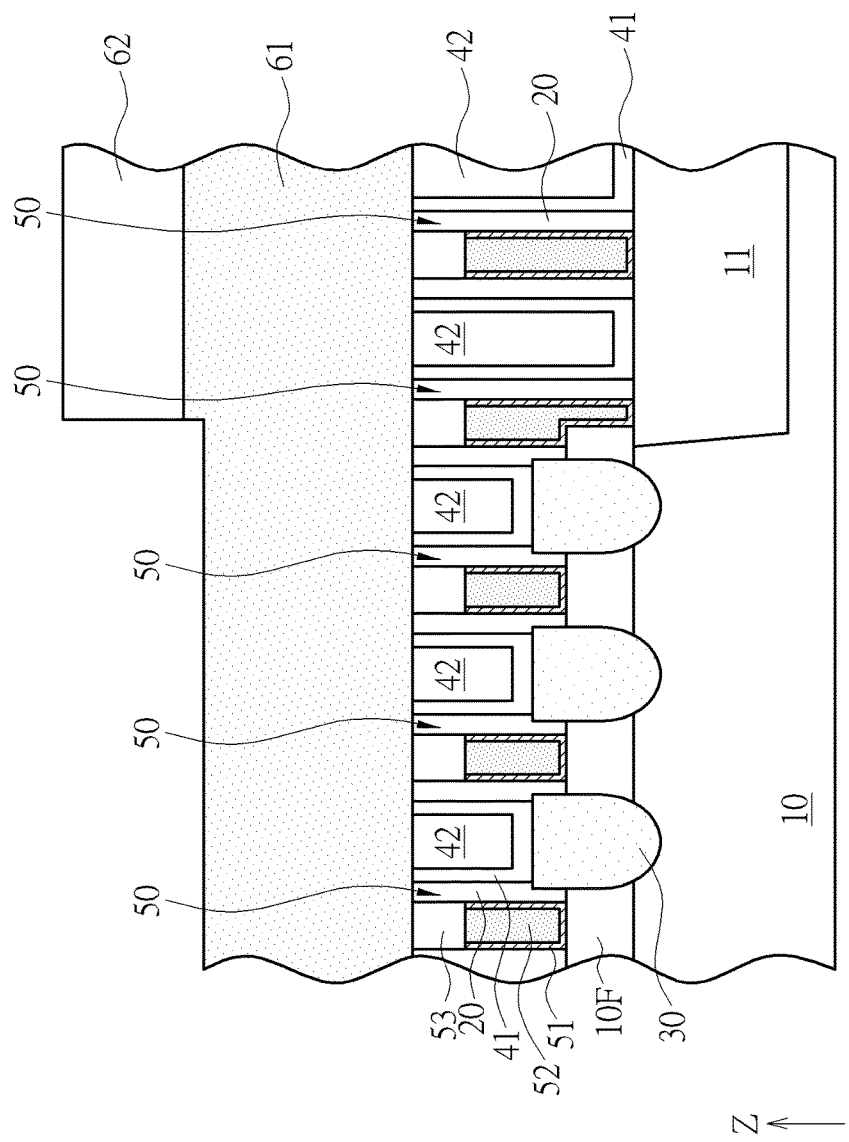

Please refer to FIG. 1 to FIG. 8, which are schematic diagrams illustrating a manufacturing method of a semiconductor device of a first embodiment of the present invention. The manufacturing method of the semiconductor device of this embodiment includes following steps. As shown in FIG. 1, a semiconductor substrate 10 is provided, the semiconductor substrate 10 of this embodiment may include a silicon substrate, an epitaxial silicon substrate, a silicon-germanium (SiGe) substrate, a silicon carbide (SiC) substrate or a silicon-on-insulator (SOI) substrate, but not limited thereto. The semiconductor substrate 10 may include a fin structure 10F as required, and an isolation structure 11 (e.g. shallow trench isolation, STI) may be formed in the semiconductor substrate 10 to isolate different regions, but not limited thereto. Then, at least one gate structure 50 is formed on the semiconductor substrate 10, and at least one epitaxial layer 30 is formed in the semiconductor substrate 10. In this embodiment, multiple gate structures 50 are formed on the fin structure 10F and multiple epitaxial layers 30 are formed in the fin structure 10F, and the epitaxial layers 30 are adjoining to the gate structures 50, but not limited thereto. In other embodiments of the present invention, the fin structure 10F may be excluded, so that the gate structure is formed directly on a planar substrate (not shown) and the epitaxial layer is formed in the planar substrate.

More specifically, in this embodiment, a plurality of dummy gates (not shown) may be formed on the semiconductor substrate 10 first, and the epitaxial layer 30 and other required material layers may then be formed. Next, the dummy gates are removed by using a replacement metal gate process, for example, to form the gate structures 50 and cap layers 53 on the gate structures 50, wherein each of the gate structures 50 includes a gate dielectric layer 51 and a metal gate 52, but not limited thereto. The epitaxial layers 30 may include a phosphorous silicate (SiP) epitaxial layer, a silicon-germanium (SiGe) epitaxial layer, a silicon carbide (SiC) epitaxial layer or other epitaxial layers with suitable materials. The gate dielectric layers 51 may include hafnium oxide ($HfO_2$), hafnium silicon oxide ($HfSiO_4$), hafnium silicon oxynitride (HfSiON) or other high dielectric constant materials for example. The metal gates 52 may include a work function metal layer (not shown) and a low resistance metal layer (not shown) respectively, and the work function metal layer and the low resistance metal layer may respectively include conductive metal material, such as aluminum (Al), tungsten (W), copper (Cu), titanium aluminide (TiAl), titanium (Ti), titanium nitride (TiN), tantalum (Ta), Tantalum nitride (TaN), titanium aluminum oxide (TiAlO) or other suitable conductive materials. The epitaxial layers 30 may respectively include or directly form a source region/drain region disposed corresponding to one gate structure 50 through an implantation process for example, but not limited thereto.

As shown in FIG. 1, the manufacturing method of this embodiment may also selectively form a plurality of spacers 20, a plurality of contact etching stop layers (CESL) 41 and a plurality of dielectric layers 42 before the step of forming the above mentioned gate structures 50, but not limited thereto. Then, an inter-layer dielectric layer 61 is formed on the gate structures 50, the cap layers 53, the epitaxial layers 30, the spacers 20, the contact etching stop layers 41 and the dielectric layers 42. The inter-layer dielectric layer 61 of this embodiment may be regarded as a pre-metal dielectric (PMD), but not limited thereto. The material of the inter-layer dielectric layer 61 may include silicon oxide, silicon nitride, silicon oxynitride, silicon carbide, nitrogen doped carbide (NDC), tetraethylorthosilicate (TEOS) or other suitable dielectric materials.

However, one of ordinary skill in the art should understand that the method of forming the gate structures 50 is not limited to the above mentioned process. The method of forming the gate structures 50 may include other steps. For example, although the gate-last process and the high-k last process are adopted for forming the gate structures 50 in the above mentioned embodiment as explanation, the method of forming the gate structures 50 may also include a gate-first process, a high-k first process or forming metal gate structures directly on the substrate to selectively omit the replacement process of the metal gates in other embodiments.

Figure 2:
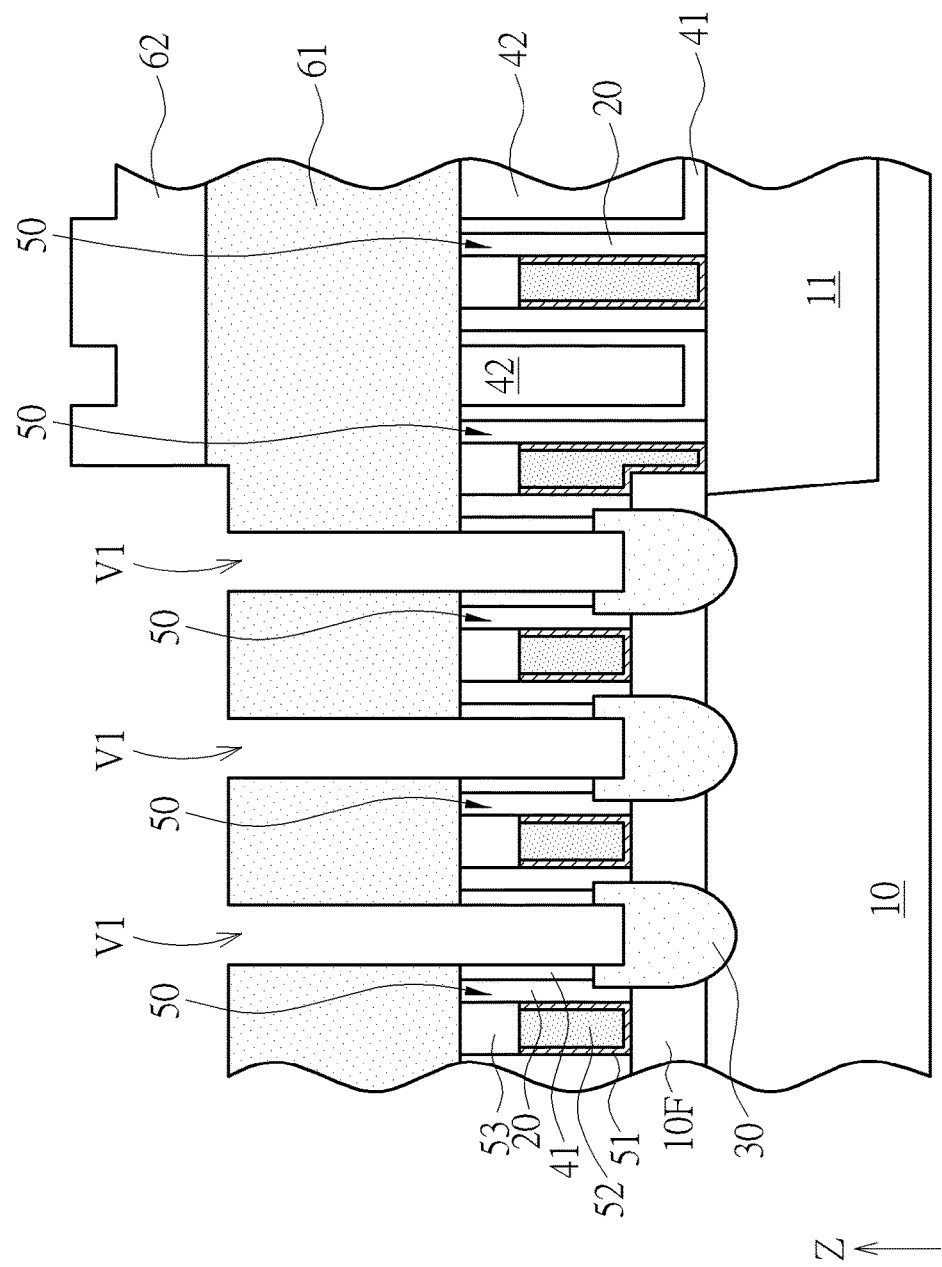
Figure 3:
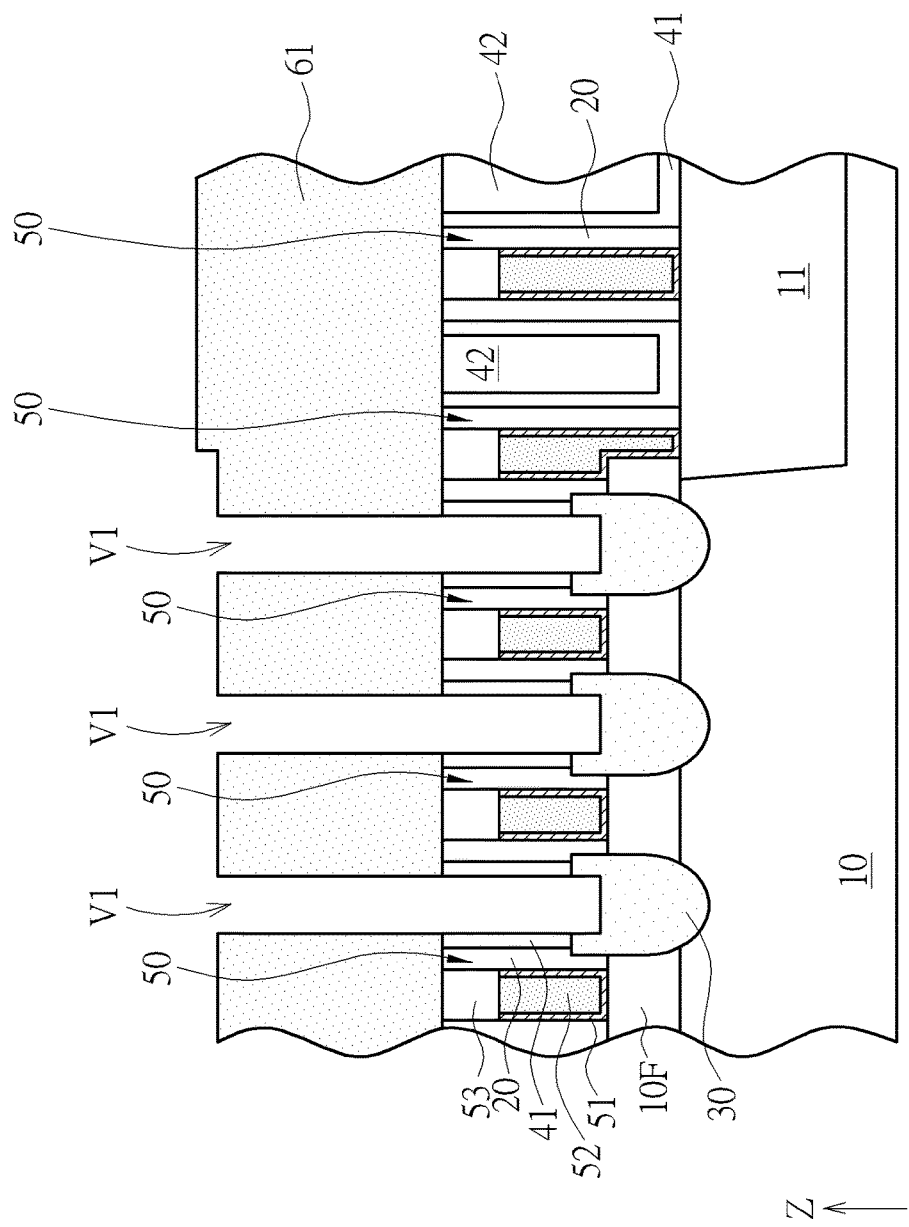
Figure 4:
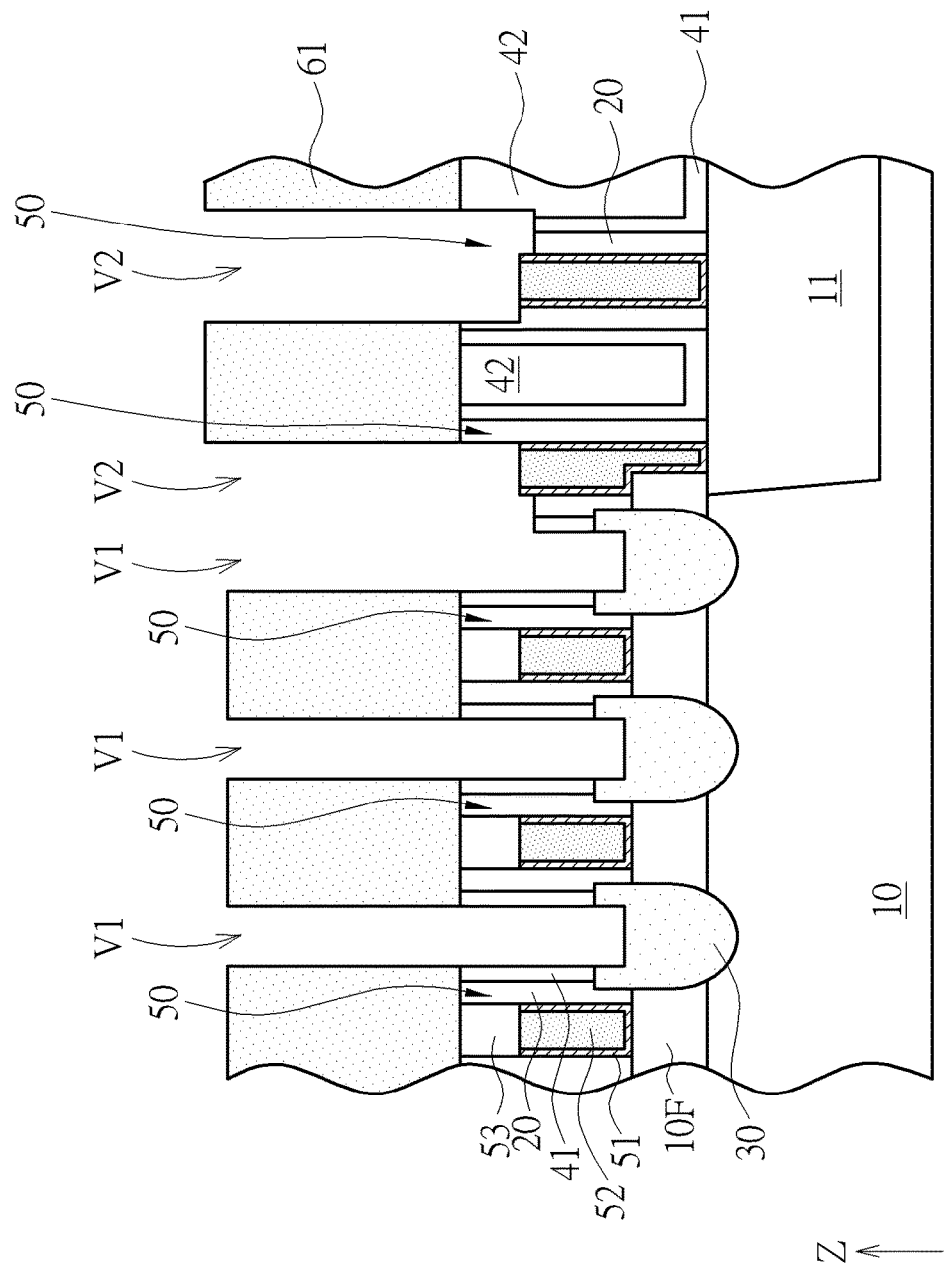

Next, as shown in FIG. 1, a mask layer 62 may be formed on the inter-layer dielectric layer 61. The mask layer 62 may be used for covering the region that is not desired to be influenced by the following processes (e.g. the process of forming the openings corresponding to the epitaxial layers 30). Then, as shown in FIG. 2 to FIG. 4, a plurality of first openings V1 corresponding to the epitaxial layers 30 and a plurality of second openings V2 corresponding to the gate structures 50 are sequentially formed. As shown in FIG. 2, a patterning process may be performed. For example, a patterned mask (not shown) may be formed and a suitable etching process may be performed to form a plurality of first openings V1. The first openings V1 penetrate the inter-layer dielectric layer 61, the corresponding dielectric layer 42 and the corresponding contact etching stop layer 41 and exposes at least one portion of the corresponding epitaxial layer 30 respectively. As shown in FIG. 2 to FIG. 3, the mask layer 62 may be removed after the first openings V1 are formed.

Another patterning process is then performed, as shown in FIG. 4. For example, another patterned mask (not shown) and a suitable etching process may be performed to form a plurality of second openings V2. The second openings V2 penetrate the inter-layer dielectric layer 61 and the corresponding cap layer 53 and expose at least one portion of the corresponding gate structure 50 respectively. In other words, the first openings V1 and the second openings V2 of this embodiment are respectively formed by different patterning processes. Furthermore, the second openings V2 are formed after the step of forming the first openings V1, and therefore the parameters of the etching processes for forming the first openings V1 and the second openings V2 can be adjusted respectively according to different combinations of objects that is required to be etched. For example, the inter-layer dielectric layer 61, the dielectric layer 42 and the contact etching stop layer 41 are required to be etched through for forming the first opening V1, and the inter-layer dielectric layer 61 and the cap layer 53 are required to be etched through for forming the second opening V2. In addition, as shown in FIG. 4, some of the gate structures 50 may be formed on the fin structure 10F for forming transistors later, and some of the other gate structures 50 may be formed on the isolation structure 11 for forming conductive lines (e.g. word line), but not limited thereto. The second openings V2 may be formed corresponding to the gate structures 50 on the fin structure 10F or corresponding to the gate structures 50 on the isolation structure 11, and some of the second openings V2 may also overlap some of the first openings V1 as required, so as to electrically connect the epitaxial layers 30 to the corresponding gate structures 50 in following steps, but not limited thereto.

Figure 5:
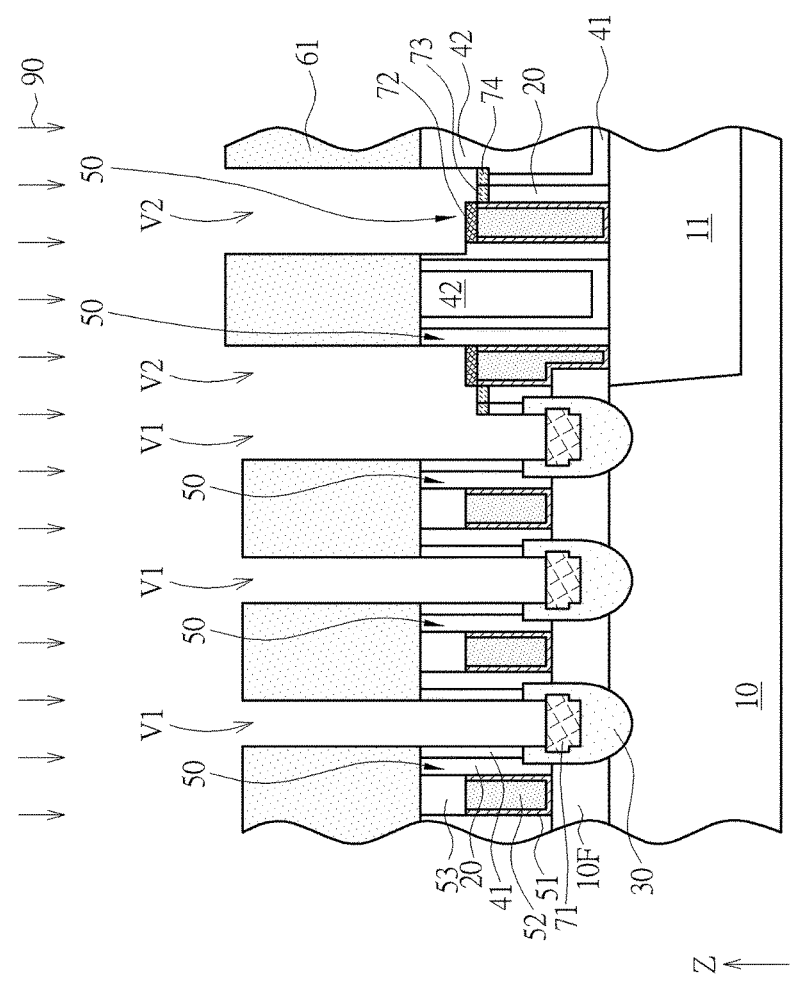

Next, as shown in FIG. 5, a pre-amorphization implantation (PAI) process 90 is performed after the first openings V1 and the second openings V2 are formed, and the PAI process 90 is performed for forming amorphous regions 71 in the epitaxial layers 30. Since the PAI process 90 is performed after the second openings V2 are formed, so that the gate structures 50, the spacers 20 and the contact etching stop layers 41 exposed by the second openings V2 may be influenced by the PAI process 90. Therefore, alloy layers 72 will be respectively formed on the gate structures 50 through the PAI process 90, first doped regions 73 will be respectively formed on the spacers 20, and second doped regions 74 will be respectively formed on the contact etching stop layers 41. In addition, since the alloy layer 72, the first doped region 73 and the second doped region 74 are formed by the PAI process 90, so that the alloy layer 72 may include an alloy of the material of the metal gate 52 and a dopant of the PAI process 90, and the first doped region 73 and the second doped region 74 may respectively include a doped region including the dopant. For example, the PAI process 90 of this embodiment may include a germanium implantation process or other implantation processes with suitable dopant(s). The alloy layer 72 may include the alloy of the material of the metal gate 52 and germanium (e.g. tungsten-germanium alloy or aluminum-germanium alloy) when the germanium implantation process is adopted, and the first doped region 73 and the second doped region 74 may respectively include a germanium doped region.

Figure 6:
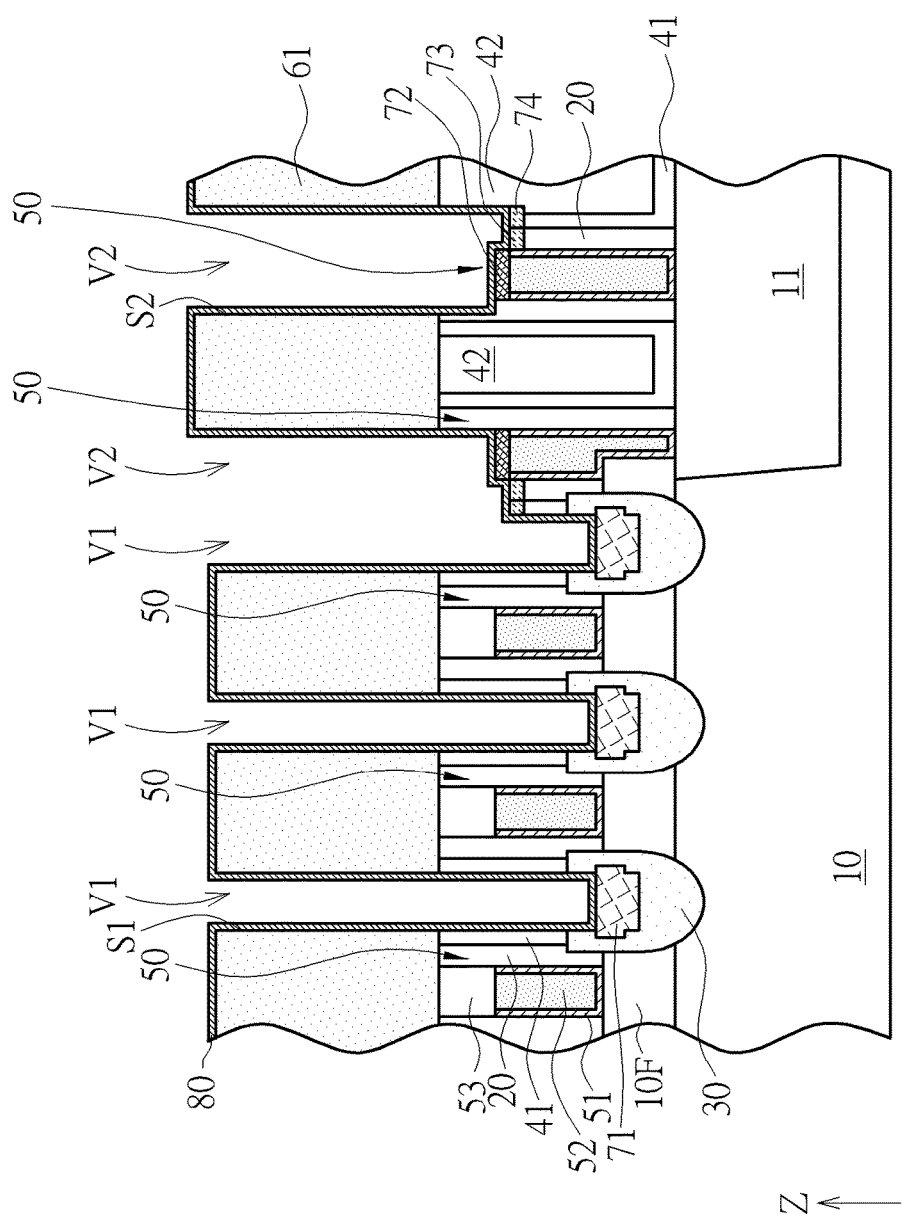
Figure 7:
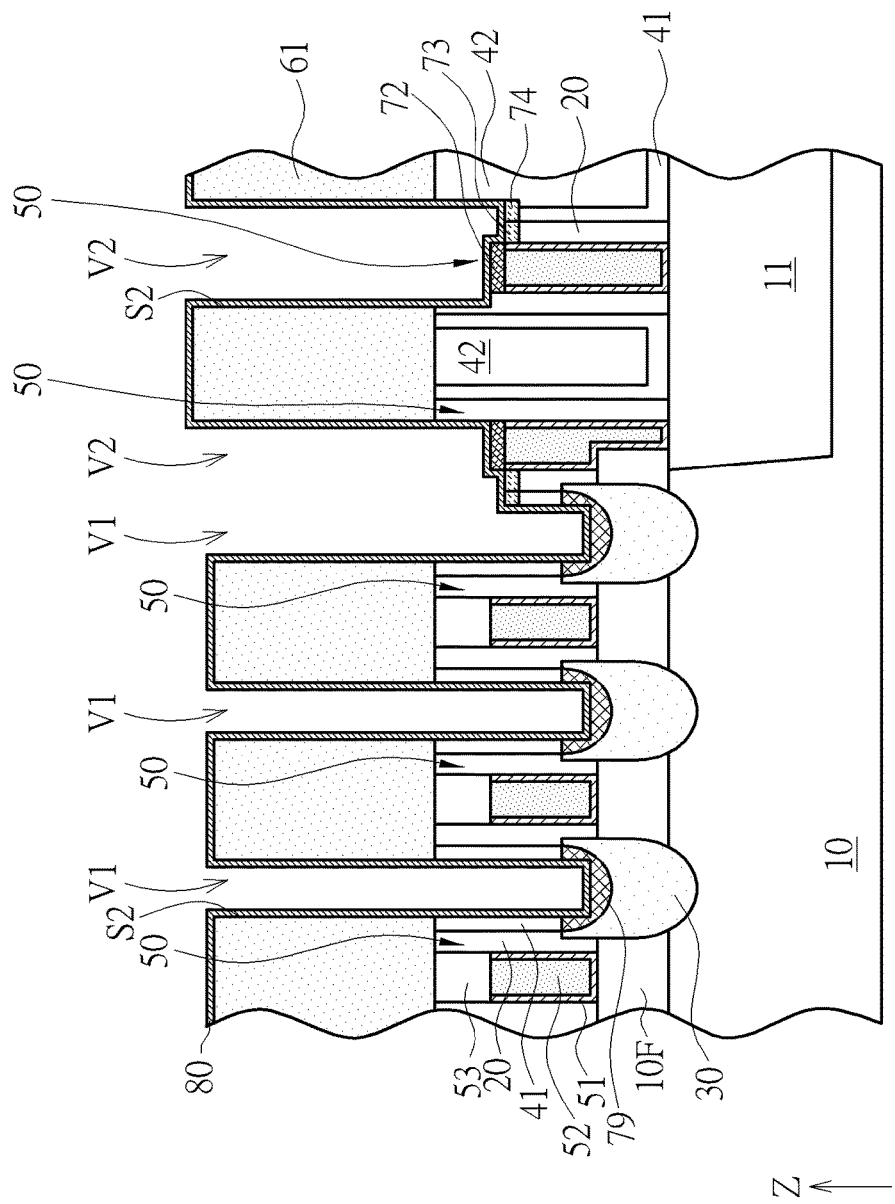

Next, as shown in FIG. 5 to FIG. 7, a metal cap layer 80 is formed on the epitaxial layers 30 after the first openings V1 and the second openings V2 are formed. A heat treatment is performed after the metal cap layer 80 is formed, so as to respectively form a silicide 79 in the epitaxial layer 30 and recrystallize the amorphous region 71 in the epitaxial layer 30. The metal cap layer 80 may include nickel (Ni), titanium (Ti), titanium nitride (TiN), tantalum (Ta), tantalum nitride (TaN), titanium aluminum oxide (TiAlO) or other single-layer structures or multi-layer stacking structures of suitable conductive materials. For example, the metal cap layer 80 of this embodiment may include a Ti layer or a multi-layer structure formed of a Ti layer and a TiN layer, and the Ti layer is preferably in contact with the amorphous regions 71 directly, but not limited thereto. The metal cap layer 80 of this embodiment is formed after the PAI process 90, and the metal cap layer 80 is formed on the inter-layer dielectric layer 61 and in the first openings V1 and second openings V2. Specifically, the metal cap layer 80 is conformally formed on the inner surfaces (e.g. the first inner surfaces S1 shown in FIG. 6) of the first openings V1 and on the inner surfaces (e.g. the second inner surfaces S2 shown in FIG. 6) of the second openings V2, and the metal cap layer 80 is directly in contact with the amorphous regions 71 and covers the alloy layers 72, the first doped regions 73 and the second doped regions 74. In addition, the silicide 79 may include titanium silicide when the metal cap layer 80 is a Ti layer or a multi-layer structure formed of Ti layer and TiN layer, but not limited thereto. It is noteworthy that the PAI process 90 of this embodiment is performed after the first openings V1 and the second openings V2 are formed, so that the amorphous regions 71 formed by the PAI process 90 will not be influenced by the patterning process, cleaning process or/and rework process for forming the second openings V2. For example, an oxide layer formed from the amorphous region 71 due to the patterning process may be avoided. Accordingly, the quality of the silicide 79 formed after the PAI process 90 and the effect of using the silicide 79 to lower the contact resistance between the metal cap layer 80 and the epitaxial layer 30 can be ensured.

Figure 8:
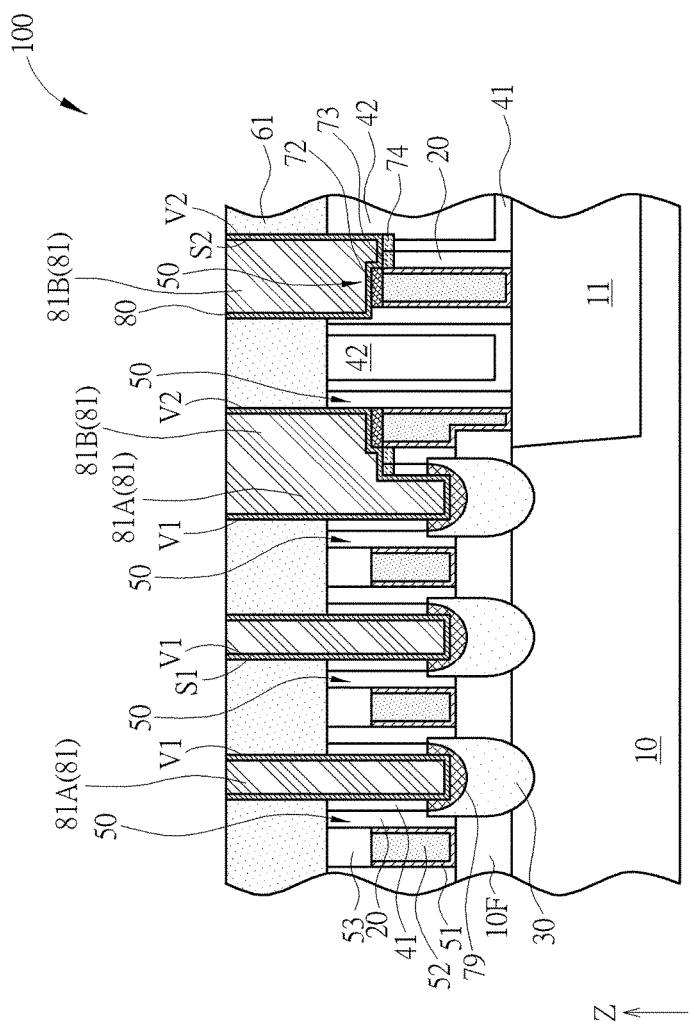

As shown in FIG. 7 to FIG. 8, a conductive material 81 may be filled into the first openings V1 and the second openings V2 after the step of forming the metal cap layer 80, and a planarization process may be performed to substantially planarize the tops of the inter-layer dielectric layer 61, the metal cap layer 80 and the conductive material 81, so as to respectively form a conductive plug 81A in the first openings V1 and respectively form a contact structure 81B in the second openings V2. Under the above mentioned circumstances, the metal cap layer 80 may be used as a barrier layer, but not limited thereto. In other embodiments of the present invention, the metal cap layer 80 may be removed before filling the conductive material 81 as required, and the conductive material 81 may be filled into the first openings V1 and the second openings V2 after another barrier layer is formed in the first openings V1 and second openings V2. In this embodiment, the conductive plugs 81A are electrically connected to the corresponding epitaxial layers 30, and the contact structures 81B are electrically connected to the corresponding gate structures 50. A portion of the metal cap layer 80 is disposed between the conductive plugs 81A and the silicides 79, and another portion of the metal cap layer 80 is disposed between the contact structures 81B and the alloy layers 72 in a vertical direction Z. A semiconductor device 100 shown in FIG. 8 may be formed through the above mentioned steps of the manufacturing process.

As shown in FIG. 8, the semiconductor device 100 of this embodiment may include the semiconductor substrate 10, at least one metal gate 52, the inter-layer dielectric layer 61, at least one second opening V2, at least one contact structure 81B and at least one alloy layer 72. The metal gate 52 is disposed on the semiconductor substrate 10. The inter-layer dielectric layer 61 is disposed on the metal gate 52. The second opening V2 penetrates the inter-layer dielectric layer 61 disposed on the metal gate 52. The contact structure 81B is disposed in the second opening V2, and the contact structure 81B is electrically connected to the metal gate 52. The alloy layer 72 is disposed on the metal gate 52 and is disposed between the contact structure 81B and the metal gate 52, and the alloy layer 72 includes the alloy of the material of the metal gate 52. For example, the alloy layer 72 may include the alloy of the material of the metal gate 52 and germanium when the PAI process in the above mentioned manufacturing method is a germanium implantation process, and therefore the alloy may be tungsten-germanium alloy or aluminum-germanium alloy for example, but not limited thereto. In other words, the materials of the alloy layer 72 and the metal gate 52 are not identical.

In addition, the semiconductor device 100 may further include at least one epitaxial layer 30, at least one silicide 79, at least one first opening V1, at least one conductive plug 81A and the metal cap layer 80. The epitaxial layer 30 is disposed in the semiconductor substrate 10, and the epitaxial layer 30 is disposed adjoining to the metal gate 52. The silicide 79 is disposed on the epitaxial layer 30, and the inter-layer dielectric layer 61 is further disposed on the silicide 79. The first opening V1 penetrates the inter-layer dielectric layer 61 disposed on the silicide 79. The conductive plug 81A is disposed in the first opening V1 for being electrically connected to the silicide 79. The metal cap layer 80 is conformally disposed on the first inner surface S1 of the first opening V1 and the second inner surface S2 of the second opening V2. The portion of the metal cap layer 80 in the first opening V1 is disposed between the conductive plug 81A and the silicide 79, and the portion of the metal cap layer 80 in the second opening V2 is disposed between the contact structure 81B and the alloy layer 72 in the vertical direction Z. The technical characteristics of each component of the semiconductor device 100 are already detailed in the above mentioned manufacturing method, and will not be redundantly described herein.

It is noteworthy that the semiconductor device 100 may further include at least one spacer 20, at least one first doped region 73, at least one contact etching stop layer 41 and at least one second doped region 74. The spacer 20 is disposed on the semiconductor substrate 10 and adjoining to the metal gate 52. The contact etching stop layer 41 is disposed on the semiconductor substrate 10 and adjoining to the spacer 20. The material of the spacer 20 may include silicon nitride, silicon carbon nitride (SiCN), silicon-carbon-oxy-nitride (SiCON) or other suitable insulating materials. The material of the contact etching stop layer 41 may include silicon nitride or other suitable insulating materials. The first doped region 73 is disposed on the spacer 20 in the vertical direction Z, and disposed between the spacer 20 and the contact structure 81B in the vertical direction Z. The second doped region 74 is disposed on the contact etching stop layer 41 in the vertical direction Z, and disposed between the contact etching stop layer 41 and the contact structure 81B in the vertical direction Z. The first doped region 73 and the second doped region 74 may respectively include a germanium doped region or other doped regions with suitable dopants.

The following description will detail another embodiment of the present invention. To simplify the description, identical components in each of the following embodiments are marked with identical symbols. For making it easier to understand the differences between the embodiments, the following description will detail the dissimilarities among different embodiments and the identical portions will not be redundantly described.

Figure 9:
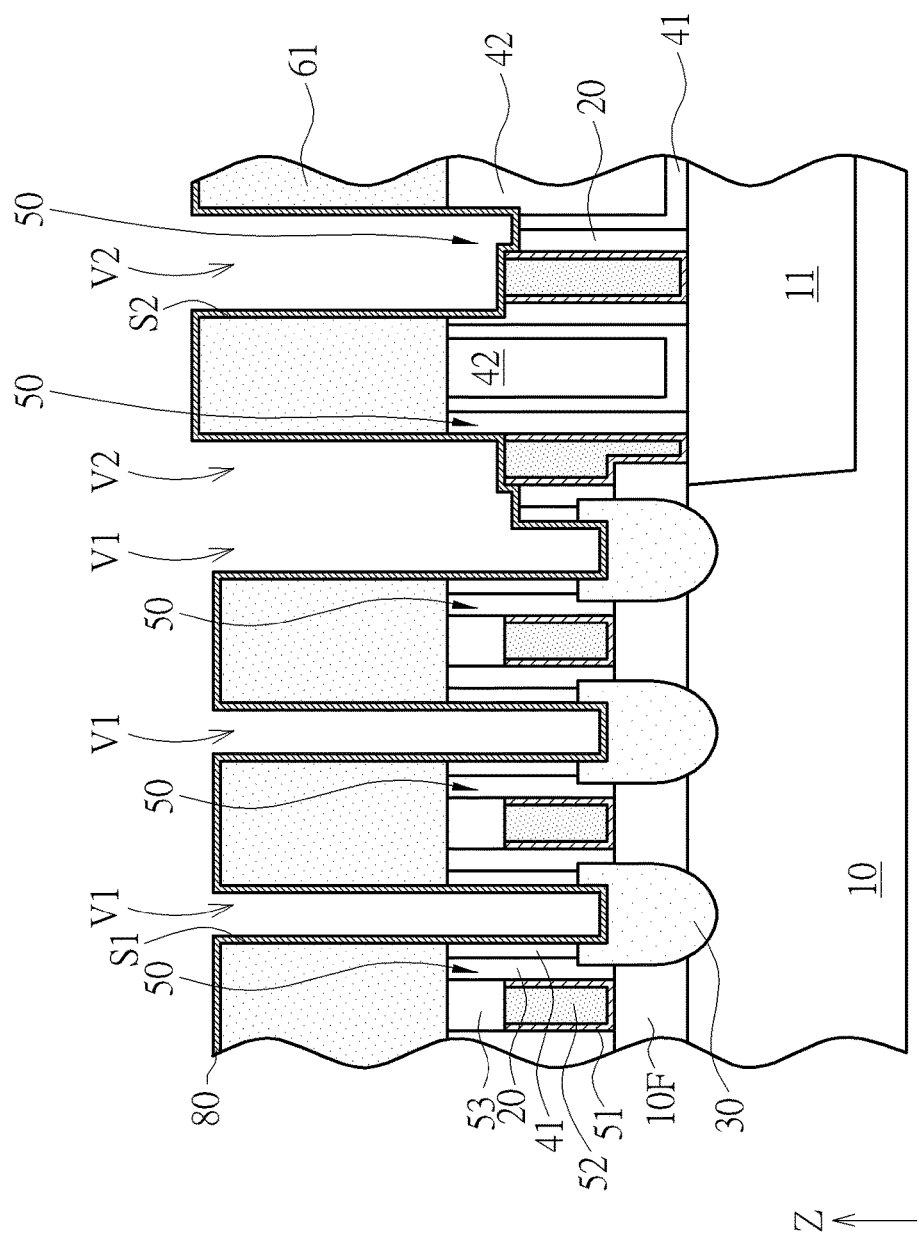
Figure 10:
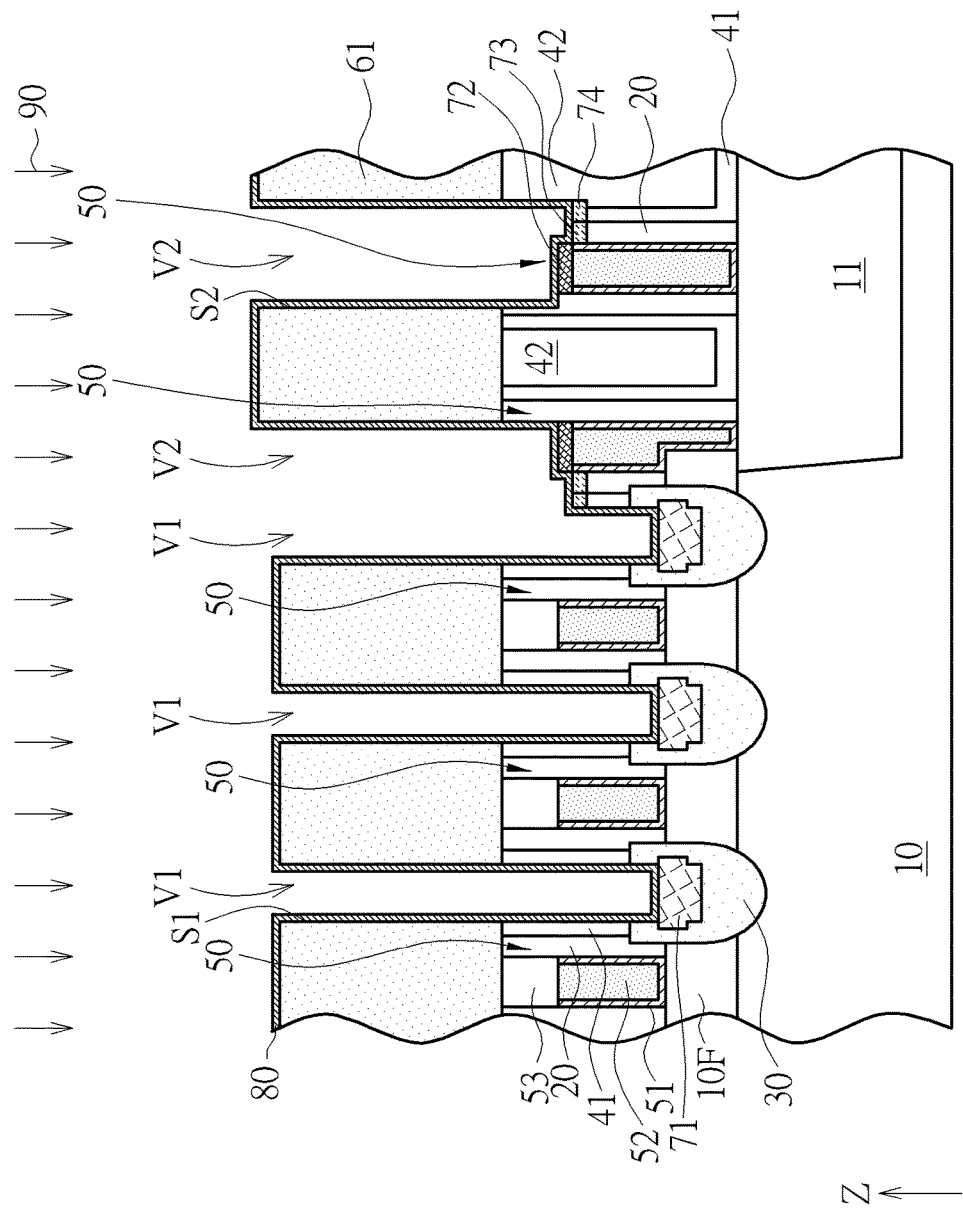

Please refer to FIG. 9 and FIG. 10, which are schematic diagrams illustrating a manufacturing method of a semiconductor device of a second embodiment of the present invention. As shown in FIG. 9 and FIG. 10, the difference between the above mentioned first embodiment and this embodiment is that a metal cap layer 80 of this embodiment is formed before the PAI process 90, and the metal cap layer 80 covers at least one portion of the epitaxial layers 30 during the PAI process 90. Therefore, the PAI process 90 of this embodiment may be regarded as an implantation through metal (ITM) process, and the amorphous regions 71, the alloy layers 72, the first doped regions 73 and the second doped regions 74 are formed underneath the metal cap layer 80. According to the manufacturing method of this embodiment, the amorphous regions 71 will not be exposed to the environment at all, and the time between the completion of the formation of the amorphous regions 71 and the start of the recrystallization process can be relatively shortened. Therefore, the possibility of the amorphous regions 71 being influenced by posterior processes can be reduced, and the contact resistance can be further lowered. It is noteworthy that the process parameters of the PAI process 90 (e.g. implantation energy) of this embodiment is required to be adjusted or/and relatively increased, compared to the manufacturing method of the above mentioned first embodiment, such that the dopant is ensured to be effectively implanted into the epitaxial layers 30 to form the desired amorphous regions 71.

In summary, in the semiconductor device and the manufacturing method of the present invention, the PAI process is performed for forming the amorphous region in the epitaxial layer after the first opening and the second opening are sequentially formed corresponding to the epitaxial layer and the gate structure respectively. Accordingly, the amorphous region is prevented from being influenced by the process for forming the second opening, and the effect of using the PAI process to reduce the contact resistance is further ensured. In addition, the PAI process of the manufacturing method of the present invention can be alternatively performed after the metal cap layer is formed, so that the amorphous region will not be exposed to the environment at all, and the time between the completion of the formation of the amorphous region and the start of the recrystallization process can be shortened. Therefore, the possibility of the amorphous region being influenced by posterior processes can be reduced, and the contact resistance can be further lowered.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   providing a semiconductor substrate;
   forming a gate structure on the semiconductor substrate;
   forming an epitaxial layer in the semiconductor substrate, wherein the epitaxial layer is adjoining to the gate structure;
   forming an inter-layer dielectric layer on the gate structure and the epitaxial layer;
   forming a first opening, the first opening penetrating the inter-layer dielectric layer and exposing at least one portion of the epitaxial layer;
   forming a second opening, the second opening penetrating the inter-layer dielectric layer and exposing at least one portion of the gate structure, wherein the second opening is formed after the step of forming the first opening; and
   performing a pre-amorphization implantation (PAI) process for forming an amorphous region in the epitaxial layer after the first opening and the second opening are formed.

2. The manufacturing method of the semiconductor device according to claim 1, further comprising:
   forming a metal cap layer on the epitaxial layer after the first opening and the second opening are formed; and
   performing a heat treatment to form a silicide in the epitaxial layer after the metal cap layer is formed.

3. The manufacturing method of the semiconductor device according to claim 2, wherein the metal cap layer is formed after the pre-amorphization implantation process, and the metal cap layer directly contacts the amorphous region.

4. The manufacturing method of the semiconductor device according to claim 2, wherein the metal cap layer is formed before the pre-amorphization implantation process, and the metal cap layer covers at least one portion of the epitaxial layer during the pre-amorphization implantation process.

5. The manufacturing method of the semiconductor device according to claim 2, wherein an alloy layer is formed on the gate structure through the pre-amorphization implantation process.

6. The manufacturing method of the semiconductor device according to claim 5, wherein the metal cap layer is further formed in the second opening, and the alloy layer is covered by the metal cap layer.

7. The manufacturing method of the semiconductor device according to claim 6, wherein the metal cap layer is conformally formed on an inner surface of the first opening and an inner surface of the second opening.

8. The manufacturing method of the semiconductor device according to claim 5, wherein the gate structure comprises a metal gate, and the alloy layer comprises an alloy of a material of the metal gate and a dopant of the pre-amorphization implantation process.

9. The manufacturing method of the semiconductor device according to claim 2, wherein the metal cap layer comprises a titanium layer, and the silicide comprises titanium silicide.

10. The manufacturing method of the semiconductor device according to claim 2, further comprising:
    forming a conductive plug in the first opening after the step of forming the metal cap layer and the pre-amorphization implantation process, wherein a portion of the metal cap layer is disposed between the conductive plug and the silicide.

11. The manufacturing method of the semiconductor device according to claim 1, wherein the pre-amorphization implantation process comprises a germanium implantation process.

12. The manufacturing method of the semiconductor device according to claim 1, wherein the first opening and the second opening are formed by different patterning processes respectively.

13. A semiconductor device, comprising:
   a semiconductor substrate;
   a metal gate disposed on the semiconductor substrate;
   an inter-layer dielectric layer disposed on the metal gate;
   a second opening penetrating the inter-layer dielectric layer disposed on the metal gate;
   a contact structure disposed in the second opening, wherein the contact structure is electrically connected to the metal gate; and
   an alloy layer disposed on the metal gate, wherein the alloy layer is disposed between the contact structure and the metal gate, and the alloy layer comprises an alloy of germanium and a material of the metal gate.

14. The semiconductor device according to claim 13, further comprising a metal cap layer conformally disposed on an inner surface of the second opening, wherein a portion of the metal cap layer is disposed between the contact structure and the alloy layer.

15. The semiconductor device according to claim 14, wherein the metal cap layer comprises a titanium layer or a multilayer structure formed of a titanium layer and a titanium nitride layer.

16. The semiconductor device according to claim 14, further comprising:
   an epitaxial layer disposed in the semiconductor substrate, wherein the epitaxial layer is disposed adjoining to the metal gate;
   a silicide disposed on the epitaxial layer, wherein the inter-layer dielectric layer is further disposed on the silicide;
   a first opening penetrating the inter-layer dielectric layer disposed on the silicide; and
   a conductive plug disposed in the first opening, wherein the conductive plug is electrically connected to the silicide, the metal cap layer is conformally disposed on an inner surface of the first opening, and a portion of the metal cap layer in the first opening is disposed between the conductive plug and the silicide.

17. The semiconductor device according to claim 13, further comprising:
   a spacer disposed on the semiconductor substrate and adjoining to the metal gate; and
   a first doped region disposed on the spacer in a vertical direction, wherein the first doped region is disposed between the spacer and the contact structure in the vertical direction.

18. The semiconductor device according to claim 17, further comprising:
   a contact etching stop layer disposed on the semiconductor substrate and adjoining to the spacer; and
   a second doped region disposed on the contact etching stop layer in the vertical direction, wherein the second doped region is disposed between the contact etching stop layer and the contact structure in the vertical direction.

19. The semiconductor device according to claim 18, wherein the first doped region and the second doped region respectively comprise a germanium doped region.

* * * * *